US010236337B2

(12) United States Patent
Jung et al.

(10) Patent No.: US 10,236,337 B2
(45) Date of Patent: Mar. 19, 2019

(54) SEMICONDUCTOR DEVICE AND METHOD OF FORMING SUBSTRATE INCLUDING EMBEDDED COMPONENT WITH SYMMETRICAL STRUCTURE

(71) Applicant: STATS ChipPAC Pte. Ltd., Singapore (SG)

(72) Inventors: JinHee Jung, Busan (KR); HyungSang Park, Gyeonggi-do (KR); SungSoo Kim, Seoul (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/797,107

(22) Filed: Oct. 30, 2017

(65) Prior Publication Data
US 2018/0053819 A1 Feb. 22, 2018

Related U.S. Application Data

(62) Division of application No. 14/722,872, filed on May 27, 2015, now Pat. No. 9,837,484.

(51) Int. Cl.
*H01L 23/538* (2006.01)
*H01L 49/02* (2006.01)
(Continued)

(52) U.S. Cl.
CPC .......... *H01L 28/40* (2013.01); *H01L 21/6835* (2013.01); *H01L 23/5389* (2013.01);
(Continued)

(58) Field of Classification Search
CPC ........... H01L 23/5389; H01L 23/49838; H01L 24/19; H01L 24/20; H01L 24/23;
(Continued)

(56) References Cited

U.S. PATENT DOCUMENTS 5,344,592 A * 9/1994 Wilczek ............ B23K 35/3612
252/512
5,491,362 A 2/1996 Hamzehdoost et al.
(Continued)

FOREIGN PATENT DOCUMENTS

JP 2002-118366 * 4/2002 ............... H05K 3/46
JP 2004-153084 * 5/2004 ............... H05K 3/46

OTHER PUBLICATIONS

Machine translation, Inagaki, Japanese Patent Pub. No. JP 2002-118366, translation date: Mar. 1, 2018, Espacenet, all pages.*
(Continued)

*Primary Examiner* — Victoria K. Hall
(74) *Attorney, Agent, or Firm* — Robert D. Atkins; Patent Law Group: Atkins and Associates, P.C.

(57) ABSTRACT

A semiconductor device comprises a first conductive layer. A second conductive layer is formed over the first conductive layer. A semiconductor component is disposed over the first conductive layer. The second conductive layer lies in a plane between a top surface of the semiconductor component and a bottom surface of the semiconductor component. A third conductive layer is formed over the semiconductor component opposite the first conductive layer. The semiconductor device includes a symmetrical structure. A first insulating layer is formed between the first conductive layer and semiconductor component. A second insulating layer is formed between the semiconductor component and third conductive layer. A height of the first insulating layer between the first conductive layer and semiconductor component is between 90% and 110% of a height of the second insulating layer between the semiconductor component and third conductive layer. The semiconductor component includes a passive device.

25 Claims, 9 Drawing Sheets

(51) Int. Cl.
*H01L 21/683* (2006.01)
*H01L 23/00* (2006.01)
*H05K 1/18* (2006.01)
*H01L 23/498* (2006.01)
*H01L 23/50* (2006.01)
*H01L 21/48* (2006.01)
*H05K 3/46* (2006.01)

(52) U.S. Cl.
CPC ............. *H01L 24/19* (2013.01); *H01L 24/25* (2013.01); *H05K 1/185* (2013.01); *H01L 21/486* (2013.01); *H01L 23/49827* (2013.01); *H01L 23/50* (2013.01); *H01L 2221/68345* (2013.01); *H01L 2224/04105* (2013.01); *H01L 2224/2518* (2013.01); *H01L 2224/32225* (2013.01); *H01L 2224/82031* (2013.01); *H01L 2224/82039* (2013.01); *H01L 2224/82047* (2013.01); *H01L 2224/83005* (2013.01); *H01L 2224/92144* (2013.01); *H05K 3/4664* (2013.01); *H05K 2201/10015* (2013.01)

(58) Field of Classification Search
CPC ..... H01L 24/24; H01L 24/25; H01L 2224/18; H01L 2224/19; H01L 2224/20; H01L 2224/21; H01L 2224/2101; H01L 2224/2105; H01L 2224/211; H01L 2224/214; H01L 2224/215; H01L 2224/22; H01L 2224/2201; H01L 2224/2205; H01L 2224/221; H01L 2224/224; H01L 2224/225; H01L 2224/25505; H01L 21/4846; H01L 28/40; H01L 49/02
USPC .................................. 257/698; 438/125, 126
See application file for complete search history.

(56) References Cited

U.S. PATENT DOCUMENTS

| | | | |
|---|---|---|---|
| 6,214,525 B1 | 4/2001 | Boyko et al. | |
| 7,341,890 B2 | 3/2008 | Ishimaru et al. | |
| 8,772,924 B2 | 7/2014 | Nalla et al. | |
| 9,559,088 B2* | 1/2017 | Gonzalez | H01L 23/5389 |
| 9,627,227 B2 | 4/2017 | Malatkar et al. | |
| 2004/0183192 A1* | 9/2004 | Otsuka | H01L 23/5384 |
| | | | 257/734 |
| 2005/0230835 A1* | 10/2005 | Sunohara | H01L 23/5389 |
| | | | 257/758 |
| 2006/0003495 A1* | 1/2006 | Sunohara | H01L 21/4857 |
| | | | 438/124 |
| 2006/0145331 A1 | 7/2006 | Cho et al. | |
| 2006/0191711 A1* | 8/2006 | Cho | H01L 23/5389 |
| | | | 174/260 |
| 2006/0193106 A1* | 8/2006 | Kobayashi | H01G 9/048 |
| | | | 361/540 |
| 2007/0052086 A1* | 3/2007 | Oi | H01L 23/5389 |
| | | | 257/698 |
| 2007/0069363 A1* | 3/2007 | Kawabata | H01L 21/568 |
| | | | 257/698 |
| 2007/0141759 A1 | 6/2007 | Nagase et al. | |
| 2007/0155060 A1 | 7/2007 | Ogawa et al. | |
| 2008/0196931 A1* | 8/2008 | Lee | H01L 23/49822 |
| | | | 174/260 |
| 2008/0211086 A1* | 9/2008 | Morita | H01L 23/5389 |
| | | | 257/E21.505 |
| 2009/0224378 A1 | 9/2009 | Chen et al. | |
| 2010/0019368 A1 | 1/2010 | Shin et al. | |
| 2010/0295170 A1* | 11/2010 | Komura | H01L 23/3677 |
| | | | 257/700 |
| 2011/0001245 A1* | 1/2011 | Jobetto | H01L 21/486 |
| | | | 257/773 |
| 2011/0100689 A1 | 5/2011 | Byun et al. | |
| 2011/0176246 A1 | 7/2011 | Kim et al. | |
| 2011/0214913 A1 | 9/2011 | Lee et al. | |
| 2011/0216515 A1 | 9/2011 | Lee et al. | |
| 2011/0228464 A1 | 9/2011 | Guzek et al. | |
| 2011/0290546 A1 | 12/2011 | Lee et al. | |
| 2012/0037404 A1 | 2/2012 | Hsu et al. | |
| 2012/0037411 A1 | 2/2012 | Hsu et al. | |
| 2012/0199971 A1 | 8/2012 | Shim et al. | |
| 2012/0293973 A1 | 11/2012 | Nakamura et al. | |
| 2013/0140683 A1 | 6/2013 | Pagaila | |
| 2013/0285254 A1* | 10/2013 | Kainuma | H01L 24/18 |
| | | | 257/774 |
| 2014/0070396 A1 | 3/2014 | Kyozuka et al. | |
| 2014/0097009 A1 | 4/2014 | Kaneko et al. | |
| 2014/0182897 A1* | 7/2014 | Lee | H05K 3/002 |
| | | | 174/251 |
| 2014/0321084 A1 | 10/2014 | Lee et al. | |
| 2014/0363929 A1* | 12/2014 | Malatkar | H01L 25/16 |
| | | | 438/127 |
| 2015/0001708 A1 | 1/2015 | Lin | |
| 2015/0014861 A1 | 1/2015 | Teh et al. | |
| 2015/0091176 A1* | 4/2015 | Otremba | H01L 23/13 |
| | | | 257/773 |
| 2015/0171002 A1 | 6/2015 | Jeon et al. | |
| 2015/0245473 A1 | 8/2015 | Shimizu et al. | |
| 2016/0104668 A1* | 4/2016 | Lii | H01L 25/50 |
| | | | 257/774 |

OTHER PUBLICATIONS

Machine translation, Naruse, Japanese Patent Pub. No. JP 2004-153084, translation date: Mar. 1, 2018, Espacenet, all pages.*

* cited by examiner

SEMICONDUCTOR DEVICE AND METHOD OF FORMING SUBSTRATE INCLUDING EMBEDDED COMPONENT WITH SYMMETRICAL STRUCTURE

CLAIM TO DOMESTIC PRIORITY

The present application is a division of U.S. patent application Ser. No. 14/722,872, now U.S. Pat. No. 9,837,484, filed May 27, 2015, which application is incorporated herein by reference.

FIELD OF THE INVENTION

The present invention relates in general to semiconductor devices and, more particularly, to a semiconductor device and method of forming a substrate including an embedded component with a symmetrical structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a thinner profile or a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. One method of incorporating IPDs into a system is to embed the IPDs in a substrate to form an embedded passive substrate (EPS). In a conventional EPS one metal layer is formed directly over the passive component and the other metal layer is formed under the passive component, between stacked thick insulating layers. The multiple levels of metal layers and insulating layers cause uneven heat management and long signal loop lengths. Accordingly, conventional EPSs are prone to warpage and electrical noise issues.

DETAILED DESCRIPTION OF THE DRAWINGS

Figure 1:
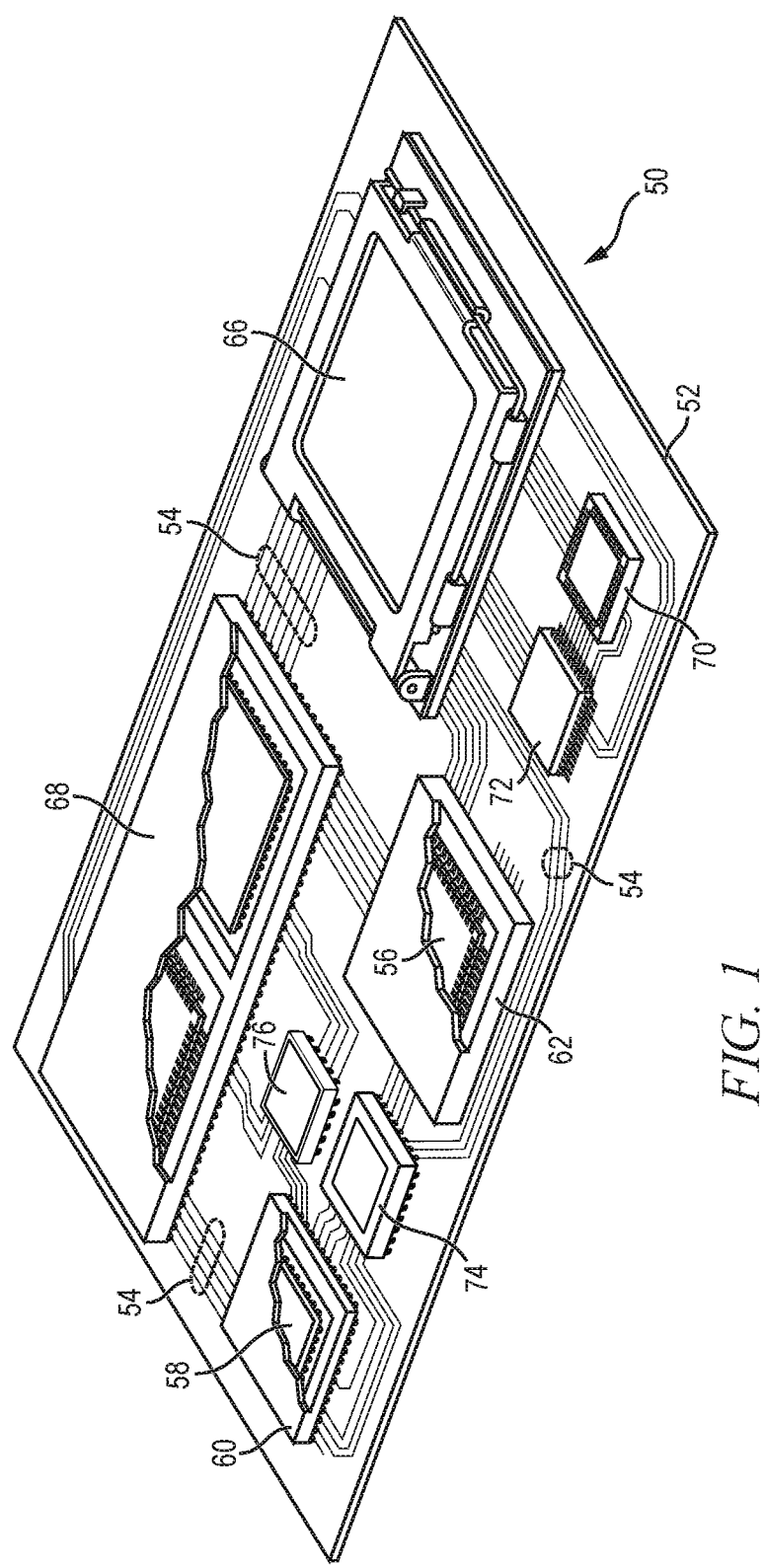
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and wafer level chip scale package (WLCSP) 76 are shown mounted on PCB 52. In one embodiment, eWLB 74 is a fan-out wafer level package (Fo-WLP) and WLCSP 76 is a fan-in wafer level package (Fi-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
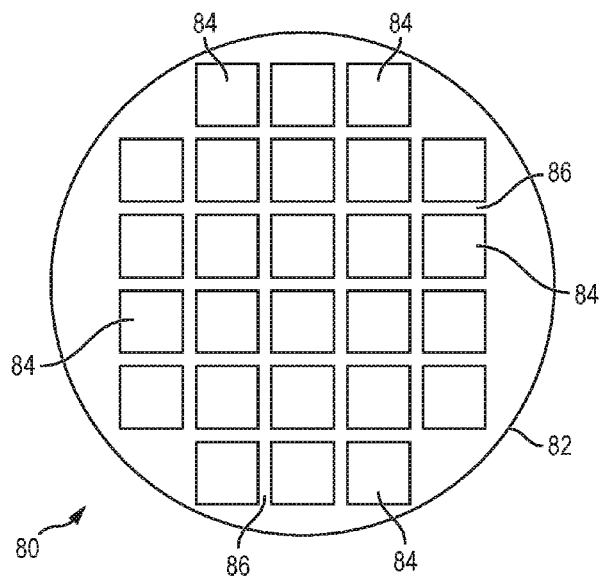
FIGS. 2a-2d illustrate a semiconductor wafer with a plurality of semiconductor die separated by a saw street.

FIG. 2a shows a semiconductor wafer 80 with a base substrate material 82, such as silicon, germanium, aluminum phosphide, aluminum arsenide, gallium arsenide, gallium nitride, indium phosphide, silicon carbide, or other bulk semiconductor material for structural support. A plurality of semiconductor die or components 84 is formed on wafer 80 separated by a non-active, inter-die wafer area or saw street 86 as described above. Saw street 86 provides cutting areas to singulate semiconductor wafer 80 into individual semiconductor die 84. In one embodiment, semiconductor wafer 80 has a width or diameter of 100-450 millimeters (mm).

Figure 2B:
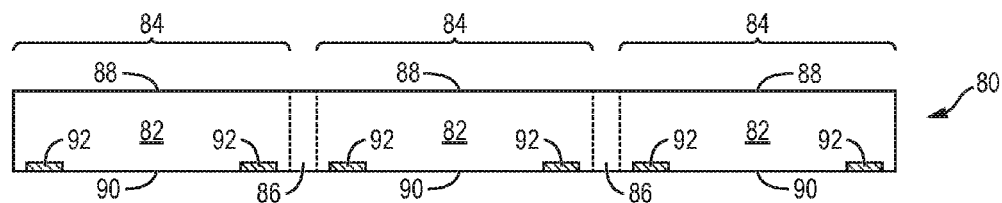

FIG. 2b shows a cross-sectional view of a portion of semiconductor wafer 80. Each semiconductor die 84 has a back or non-active surface 88 and an active surface 90 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 90 to implement analog circuits or digital circuits, such as digital signal processor (DSP), ASIC, MEMS, memory, or other signal processing circuit. In one embodiment, active surface 90 contains a MEMS, such as an accelerometer, gyroscope, strain gauge, microphone, or other sensor responsive to various external stimuli.

Semiconductor die 84 may contain baseband circuits that are susceptible to EMI, RFI, and other interference generated by other devices. In one embodiment, semiconductor die 84 may contain one or more IPDs that generate EMI or RFI. Therefore, each of these passive circuit elements has the potential to interfere with adjacent devices.

An electrically conductive layer 92 is formed over active surface 90 of semiconductor die 84 using PVD, CVD, electrolytic plating, electroless plating process, or other suitable metal deposition process. Conductive layer 92 includes one or more layers of aluminum (Al), copper (Cu), tin (Sn), nickel (Ni), gold (Au), silver (Ag), or other suitable electrically conductive material or combination thereof. Conductive layer 92 operates as contact pads electrically connected to the circuits on active surface 90. Conductive layer 92 is formed as contact pads disposed side-by-side a first distance from the edge of semiconductor die 84, as shown in FIG. 2b. Alternatively, conductive layer 92 is formed as contact pads that are offset in multiple rows such that a first row of contact pads is disposed a first distance from the edge of the die, and a second row of contact pads alternating with the first row is disposed a second distance from the edge of the die. In one embodiment, back surface 88 of semiconductor wafer 80 undergoes an optional backgrinding operation with a grinder or other suitable mechanical or etching process to remove a portion of base substrate material 82 and reduce the thickness of semiconductor wafer 80 including semiconductor die 84.

Semiconductor wafer 80 undergoes electrical testing and inspection as part of a quality control process. Manual visual inspection and automated optical systems are used to perform inspections on semiconductor wafer 80. Software can be used in the automated optical analysis of semiconductor wafer 80. Visual inspection methods may employ equipment such as a scanning electron microscope, high-intensity or ultra-violet light, or metallurgical microscope. Semiconductor wafer 80 is inspected for structural characteristics including warpage, thickness variation, surface particulates, irregularities, cracks, delamination, and discoloration.

Figure 2C:
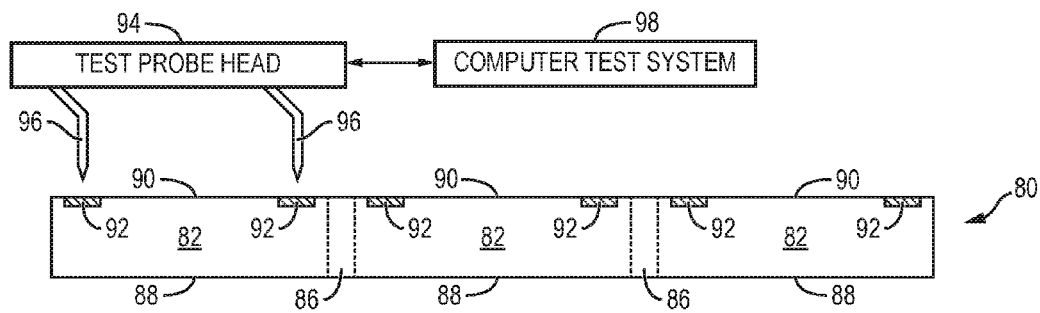

The active and passive components within semiconductor die 84 undergo testing at the wafer level for electrical performance and circuit function. Each semiconductor die 84 is tested for functionality and electrical parameters, as shown in FIG. 2c, using a test probe head 94 including a plurality of probes or test leads 96, or other testing device. Probes 96 are used to make electrical contact with nodes or conductive layer 92 on each semiconductor die 84 and provide electrical stimuli to the contact pads. Semiconductor die 84 responds to the electrical stimuli, which is measured by computer test system 98 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 80 enables semiconductor die 84 that pass to be designated as known good die (KGD) for use in a semiconductor package.

Figure 2D:
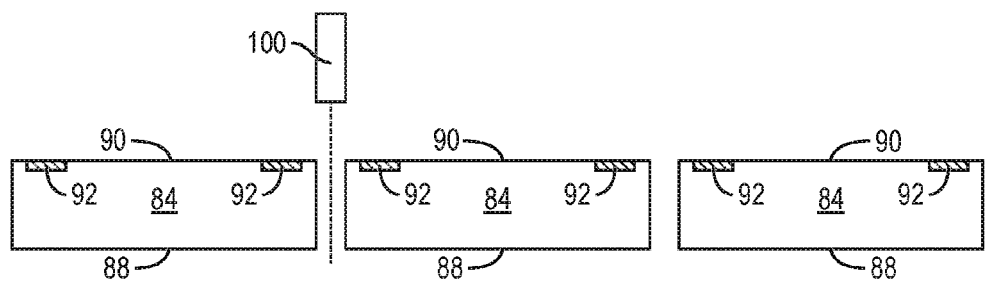

In FIG. 2d, semiconductor wafer 80 is singulated through saw street 86 using a saw blade or laser cutting tool 100 into individual semiconductor die 84. Individual semiconductor die 84 can be inspected and electrically tested for identification of KGD post singulation.

Figure 3A:
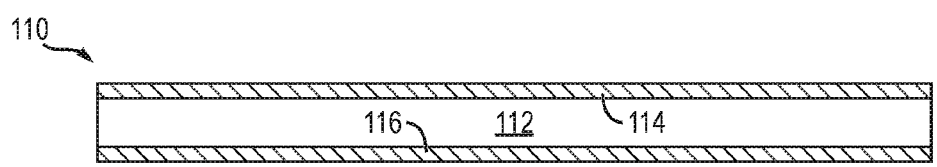
FIGS. 3a-3o illustrate a process of forming a substrate with an embedded passive device and a symmetrical structure.

FIG. 3a shows a copper clad laminate (CCL) 110 with base material 112 such as metal, silicon, polymer, polymer composite, ceramic, glass, glass epoxy, beryllium oxide, or other suitable low-cost, rigid material or bulk semiconductor material for structural support. Alternatively, base material 112 can be one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, inorganic fillers, and other reinforcement fibers or fabrics.

An electrically conductive sheet or layer 114 is formed over a top surface of base material 112 using a patterning and metal deposition process such as printing, PVD, CVD, sputtering, electrolytic plating, electroless plating, metal evaporation, metal sputtering, or other suitable metal deposition process. An electrically conductive sheet or layer 116 is formed over a bottom surface of base material 112 using a patterning and metal deposition process such as printing, PVD, CVD, sputtering, electrolytic plating, electroless plating, metal evaporation, metal sputtering, or other suitable metal deposition process. Conductive layers 114 and 116 can be one or more layers of Al, Cu, Sn, Ni, Au, Ag, or other suitable electrically conductive material. In one embodiment, conductive layers 114 and 116 are Cu foil.

Figure 3B:
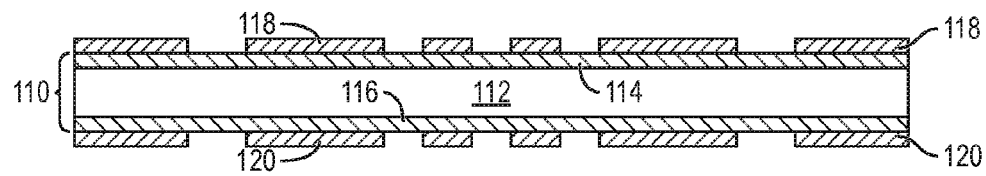

FIG. 3b shows a first metal layer or electrically conductive layer 118 formed over conductive layer 114 using a patterning and metal deposition process such as silk screen printing, photoengraving, PCB milling, printing, PVD, CVD, sputtering, electrolytic plating, electroless plating, metal evaporation, metal sputtering, or other suitable metal deposition process. Similarly, a first metal layer or electrically conductive layer 120 is formed over conductive layer 116. Conductive layers 118 and 120 can be one or more layers of Al, Cu, Sn, Ni, Au, Ag, or other suitable electrically conductive material.

Figure 3C:
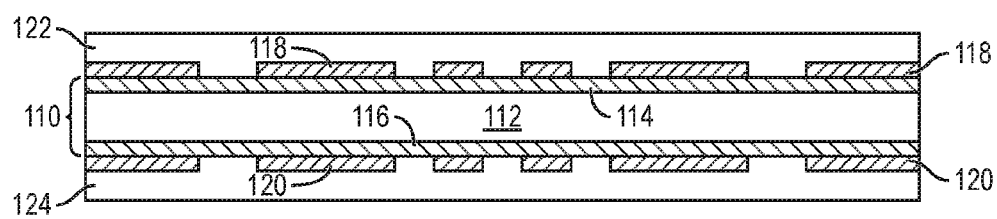

In FIG. 3c, insulating layer 122 is conformally applied to, and has a first surface that follows the contours of, conductive layer 118, openings including sidewalls of conductive layer 118 and conductive layer 114. Insulating layer 122 has a second planar surface opposite the first surface. Similarly, insulating layer 124 is conformally applied to, and has a first surface that follows the contours of, conductive layer 120, openings including sidewalls of conductive layer 120 and conductive layer 116. Insulating layer 124 has a second planar surface opposite the first surface. Insulating layers 122 and 124 contain one or more layers of prepreg, photosensitive low curing temperature dielectric resist, photosensitive composite resist, liquid crystal polymer (LCP), laminate compound film, insulation paste with filler, solder mask resist film, liquid molding compound, granular molding compound, polyimide, BCB, PBO, $SiO_2$, $Si_3N_4$, SiON, $Ta_2O_5$, $Al_2O_3$, or other material having similar insulating and structural properties. Insulating layers 122 and 124 are deposited using printing, spin coating, spray coating, lamination, or other suitable process.

Figure 3D:
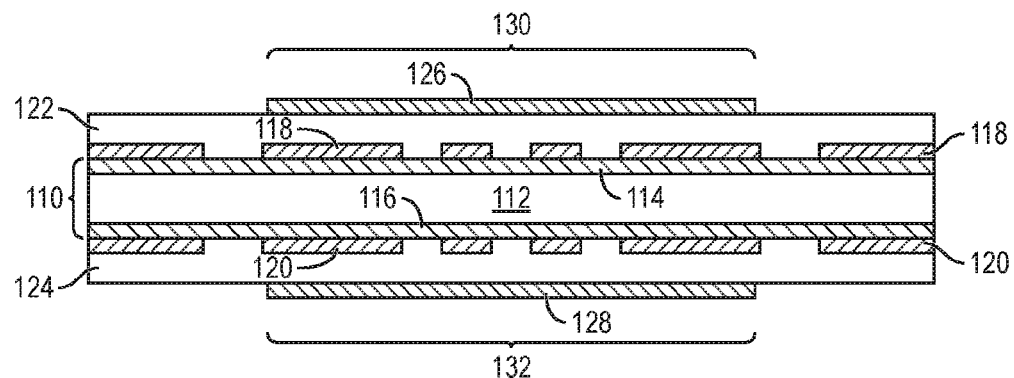

In FIG. 3d, an electrically conductive layer 126 is formed over insulating layer 122 using a patterning and metal deposition process such as silk screen printing, photoengraving, PCB milling, printing, PVD, CVD, sputtering, electrolytic plating, electroless plating, metal evaporation, metal sputtering, or other suitable metal deposition process. Similarly, an electrically conductive layer 128 is formed over insulating layer 124. Conductive layers 126 and 128 can be one or more layers of Al, Cu, Sn, Ni, Au, Ag, or other suitable electrically conductive material. In one embodiment, conductive layers 126 and 128 are patterned to form component attach areas 130 and 132, respectively. Component attach areas 130 and 132 may be larger, smaller, or identical in size to patterned conductive layer 126 and 128, respectively.

Figure 3E:
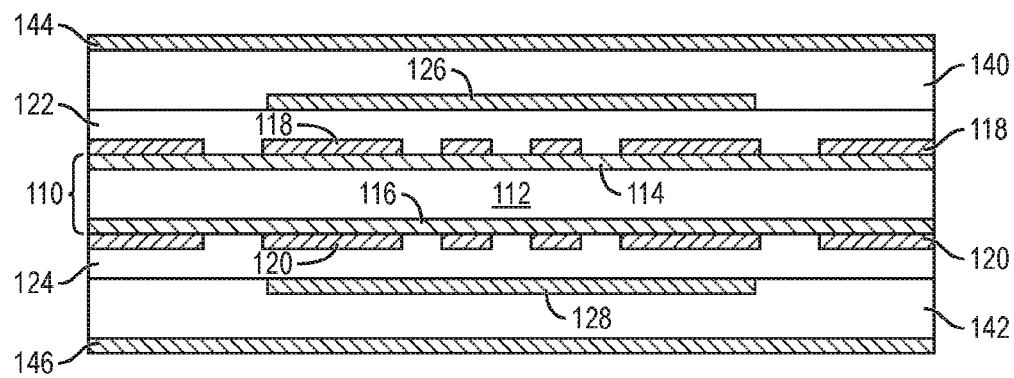

In FIG. 3e, insulating layer 140 is conformally applied to, and has a first surface that follows the contours of, insulating layer 122 and conductive layer 126. Insulating layer 140 has a second planar surface opposite the first surface. Similarly, insulating layer 142 is conformally applied to, and has a first surface that follows the contours of, insulating layer 124 and conductive layer 128. Insulating layer 142 has a second planar surface opposite the first surface. Insulating layers 140 and 142 contain one or more layers of prepreg, photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layers 140 and 142 are deposited using printing, spin coating, spray coating, lamination, or other suitable process.

A second metal layer or electrically conductive layer 144 is formed over insulating layer 140 using a patterning and metal deposition process such as silk screen printing, photoengraving, PCB milling, PVD, CVD, sputtering, electrolytic plating, electroless plating, metal evaporation, metal sputtering, or other suitable metal deposition process. Similarly, a second metal layer or electrically conductive layer 146 is formed over insulating layer 142. Conductive layers 144 and 146 can be one or more layers of Al, Cu, Sn, Ni, Au, Ag, or other suitable electrically conductive material.

Figure 3F:
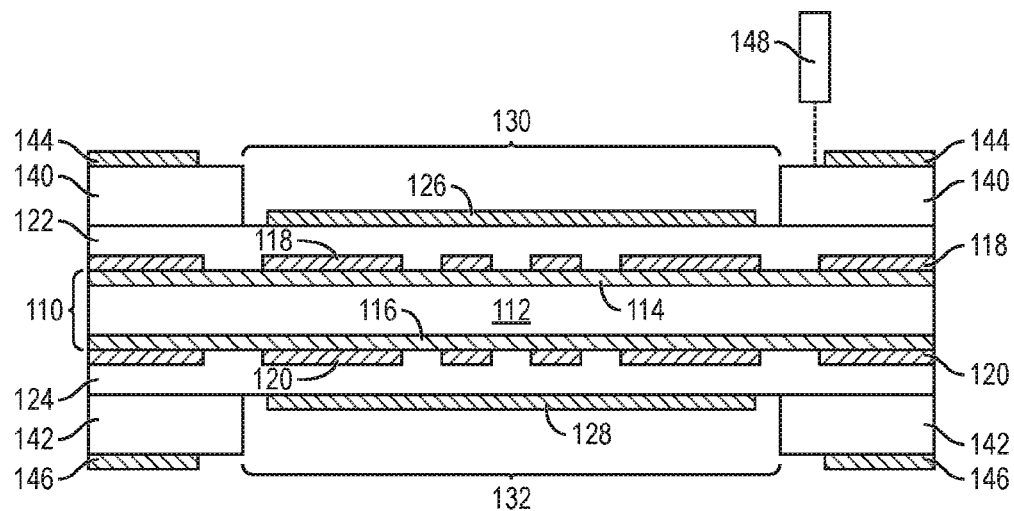

In FIG. 3f, conductive layer 144 is patterned to expose a portion of insulating layer 140. Insulating layer 140 is patterned and cured using ultraviolet (UV) exposure followed by developing, or other suitable process, or a portion of insulating layer 140 is removed by etching or other suitable process to expose conductive layer 126 at component attach area 130. In one embodiment, a portion of insulating layer 140 is removed by laser direct ablation (LDA) using laser 148 to expose conductive layer 126 at component attach area 130. Similarly, conductive layer 146 is patterned to expose a portion of insulating layer 142. Insulating layer 142 is patterned to expose conductive layer 128 at component attach area 132. In one embodiment, conductive layers 126 and 128 and act as etch stop layers. In one embodiment, a portion of insulating layer 140 exposed by conductive layer 144 remains and is not removed and a portion of insulating layer 142 exposed by conductive layer 146 remains and is not removed.

Figure 3G:
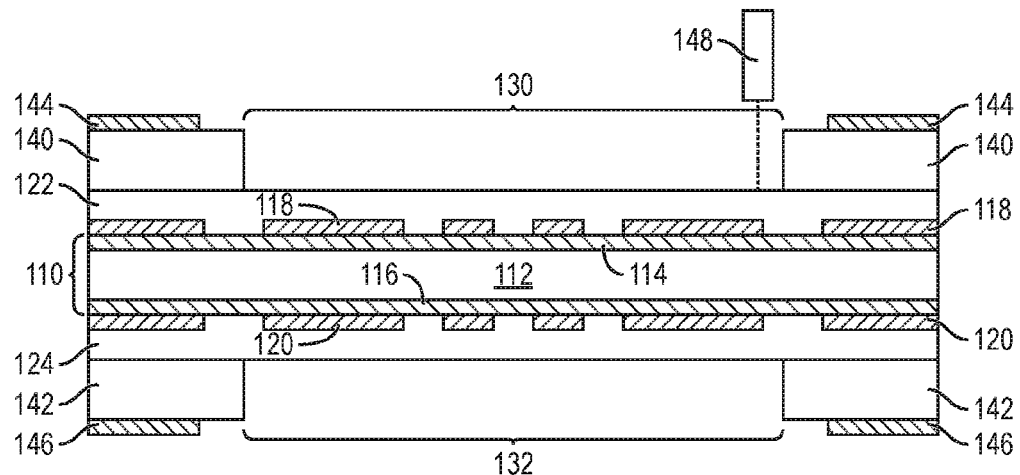

FIG. 3g shows conductive layers 126 and 128 removed by LDA using laser 148, etching, or other suitable process to expose portions of insulating layers 122 and 124, respectively. Insulating layers 122 and 124 are exposed at component attach areas 130 and 132, respectively.

Figure 3H:
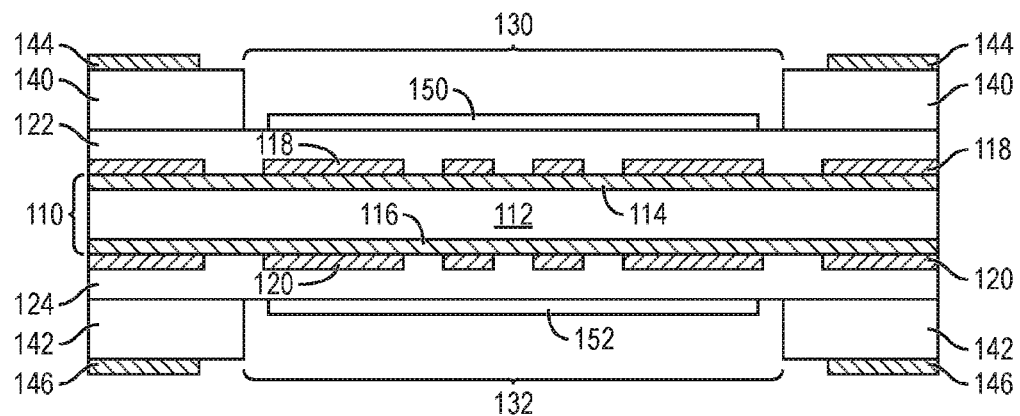

In FIG. 3h, an adhesive layer 150 is formed over insulating layer 122 at component attach area 130. Similarly, an adhesive layer 152 is formed over insulating layer 124 at component attach area 132. Adhesive layers 150 and 152 can be thermal epoxy, epoxy resin, B-stage epoxy laminating film, UV B-stage film adhesive layer, UV B-stage film adhesive layer including acrylic polymer, thermo-setting adhesive film layer, wire-in-film (WIF) encapsulant material, a suitable wafer backside coating, epoxy resin with organic filler, silica filler, or polymer filler, acrylate based adhesive, epoxy-acrylate adhesive, or a PI-based adhesive. Adhesive layers 150 and 152 are generally only minimally conductive. In some embodiments, however, adhesive layers 150 and 152 include a non-conductive material.

Figure 3I:
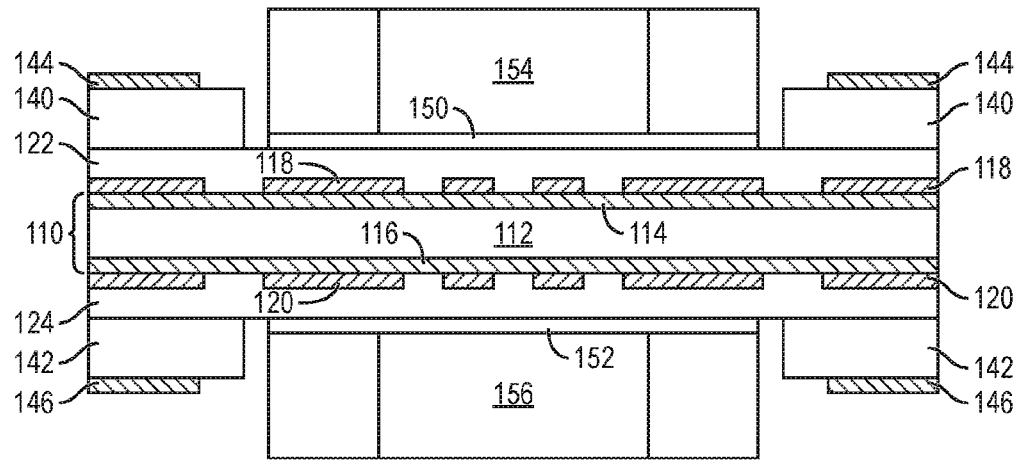

In FIG. 3i, components 154 and 156 are mounted to adhesive layers 150 and 152 at component attach areas 130 and 132, respectively, using, for example, a pick and place operation. Components 154 and 156 may be semiconductor die 84 from FIG. 2d and may contain one or more IPDs. Components 154 and 156 may also be discrete passive devices. In one embodiment, components 154 and 156 are capacitors. Conductive layers 144 and 146 are disposed on planes, which intersect components 154 and 156, respectively. In one embodiment, conductive layers 144 and 146 are disposed at a midpoint of components 154 and 156, respectively. In other words, a plane aligned with conductive layer 144 bisects component 154, and a plane aligned with conductive layer 146 bisects component 156.

Figure 3J:
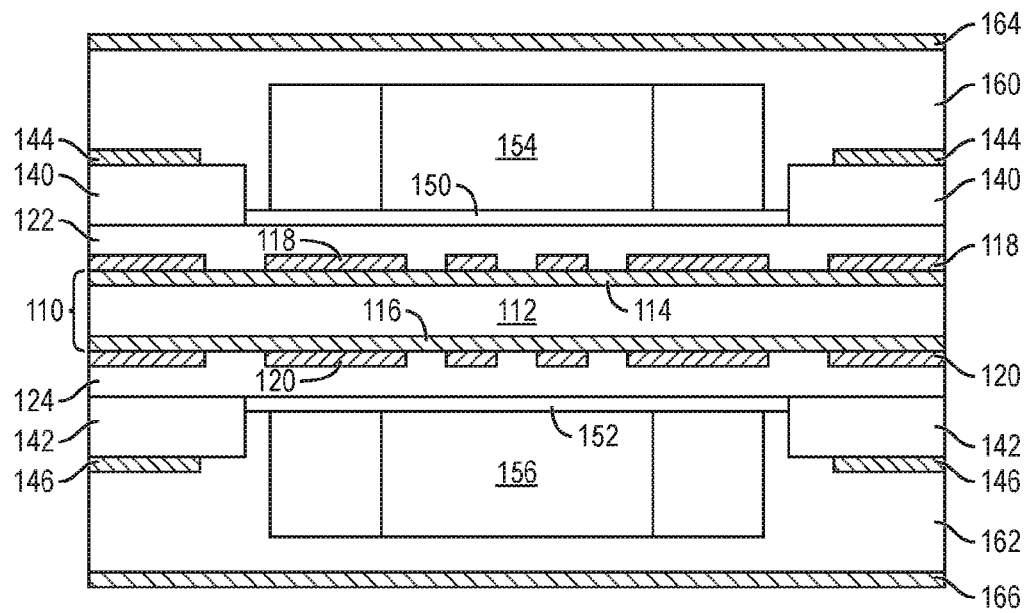

In FIG. 3j, insulating layer 160 is conformally applied to, and has a first surface that follows the contours of, insulating layer 140, conductive layer 144, adhesive layer 150, and component 154. Insulating layer 160 has a second planar surface opposite the first surface. A thickness of insulating layer 160 over a top surface of component 154 is approximately equal to a thickness of insulating layer 122 between adhesive layer 150 and conductive layer 118, creating a symmetrical substrate. Similarly, insulating layer 162 is conformally applied to, and has a first surface that follows the contours of, insulating layer 142, conductive layer 146, adhesive layer 152, and component 156. Insulating layer 162 has a second planar surface opposite the first surface. A thickness of insulating layer 162 under a bottom surface of component 156 is approximately equal to a thickness of insulating layer 124 between adhesive layer 152 and conductive layer 120, creating a symmetrical substrate. Insulating layers 160 and 162 contain one or more layers of prepreg, photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layers 160 and 162 are deposited using printing, spin coating, spray coating, lamination, or other suitable process.

Conductive layer 144 forms an embedded trace structure (ETS) between insulating layers 140 and 160. Similarly, conductive layer 146 forms an ETS between insulating layers 142 and 162. ETS 144 resides in a plane located between a top surface of component 154 and a bottom surface of component 154. ETS 146 resides in a plane located between a top surface of component 156 and a bottom surface of component 156. In one embodiment, ETS 144 resides in a plane that bisects component 154. In one embodiment, ETS 146 resides in a plane that bisects component 156.

A third metal layer or electrically conductive layer 164 is formed over insulating layer 160 using a patterning and metal deposition process such as silk screen printing, photoengraving, PCB milling, printing, PVD, CVD, sputtering, electrolytic plating, electroless plating, metal evaporation, metal sputtering, or other suitable metal deposition process. Similarly, a third metal layer or electrically conductive layer 166 is formed over insulating layer 162. Conductive layers 164 and 166 can be one or more layers of Al, Cu, Sn, Ni, Au, Ag, or other suitable electrically conductive material.

Figure 3K:
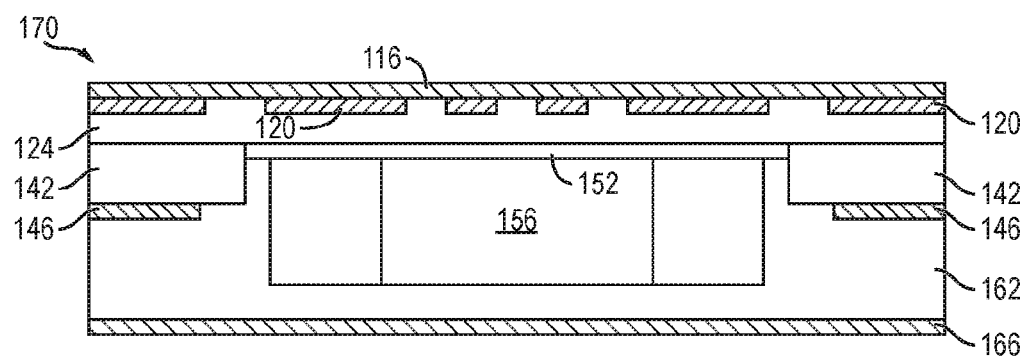

In FIG. 3k, the top and bottom symmetrical EPSs are separated. Base material 112 is removed from symmetrical three layer EPS 170 to expose conductive layer 116.

Figure 3L:
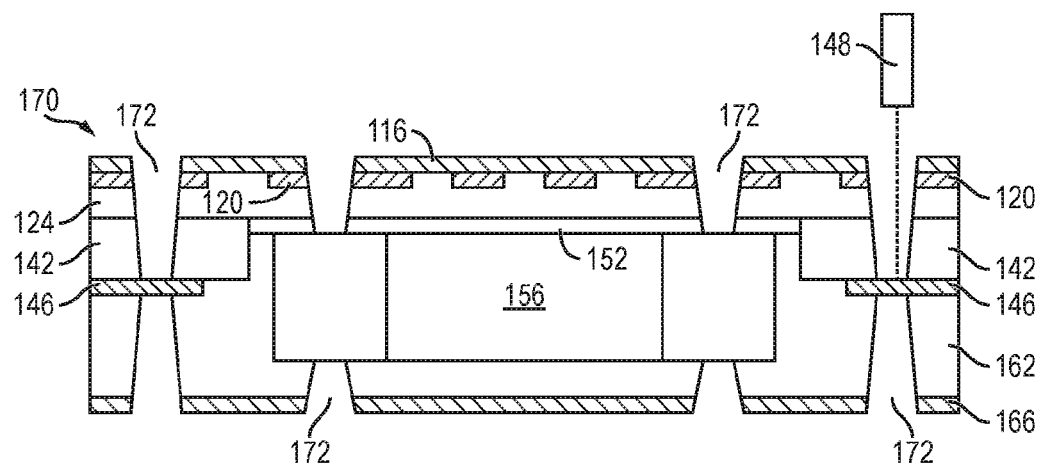

FIG. 3l shows a plurality of vias 172 formed through conductive layers 116, 120, and 166, and insulating layers 124, 142, and 162 using laser drilling, mechanical drilling, deep reactive ion etching (DRIE), or other suitable process. Vias 172 extend to both a top and a bottom surface of conductive layer or ETS 146. Vias 172 expose both surfaces of conductive layer or ETS 146. In one embodiment, the plurality of vias 172 is formed using wet/dry etching. In one embodiment, the plurality of vias 172 is formed by LDA using laser 148.

Figure 3M:
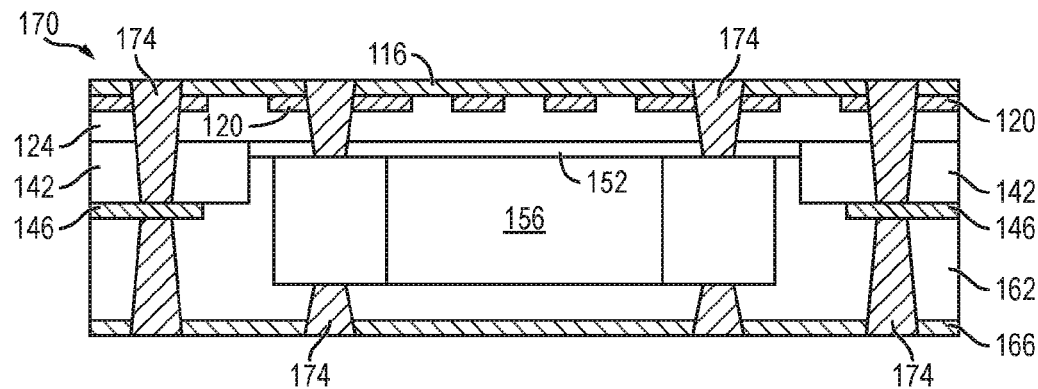

In FIG. 3m, vias 172 are filled with Al, Cu, Sn, Ni, Au, Ag, titanium (Ti), tungsten (W), or other suitable electrically conductive material or combination thereof using PVD, CVD, electrolytic plating, electroless plating process, or other suitable metal deposition process to form z-direction vertical interconnect structures or conductive vias 174. Alternatively, a conductive layer is formed over the sidewalls of vias 172 using PVD, CVD, electrolytic plating, electroless plating process, or other suitable metal deposition process, and a center portion of vias 172 is filled with a conductive filler material, e.g., Cu paste, or an insulating filler material, e.g., a polymer plug.

Figure 3N:
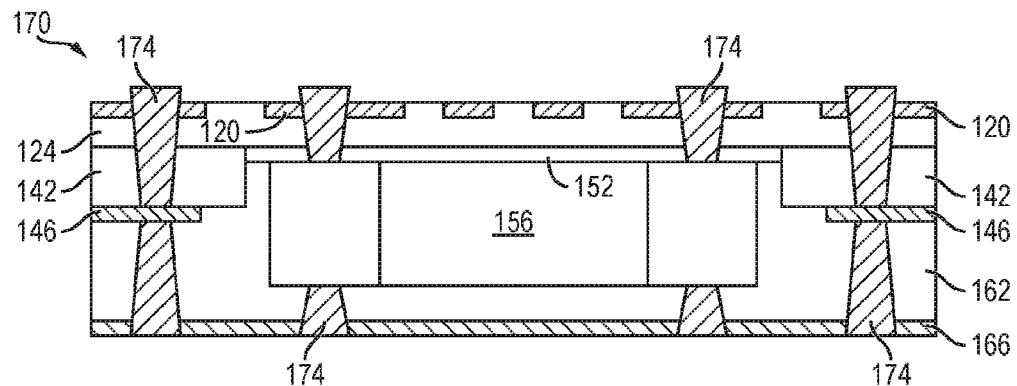

FIG. 3n shows conductive layer 116 removed by chemical etching or LDA to expose a surface of conductive layer 120, insulating layer 124, and conductive vias 174.

Figure 3O:
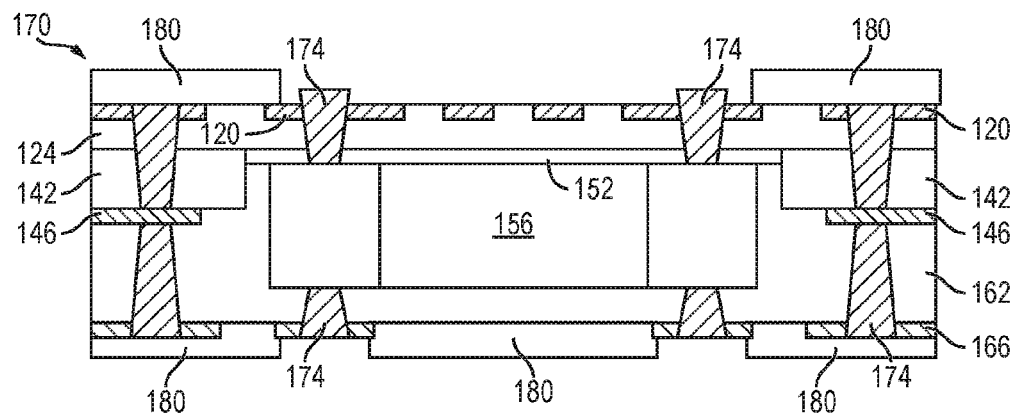

FIG. 3o shows a symmetrical three layer embedded passive substrate 170. In FIG. 3o, solder resist or mask 180 is formed over a first side of symmetrical EPS 170 including conductive layer 120, insulating layer 124, and conductive vias 174. Solder resist or mask 180 is also formed over a second side of symmetrical EPS 170 including conductive layer 166, insulating layer 162, and conductive vias 174.

Symmetrical EPS 170 of FIG. 3o includes a symmetrical structure. A thickness of insulating layer 162 over a surface of component 156 is approximately equal to a thickness of insulating layer 124 between adhesive layer 152 and conductive layer 120 and therefore EPS 170 is a symmetrical substrate. Warpage of symmetrical EPS 170 is reduced because a thickness of insulating layer 162 over a surface of component 156 is approximately equal to a thickness of insulating layer 124 between adhesive layer 152 and conductive layer 120. ETS 146 resides in a plane located between a top surface of component 156 and a bottom surface of component 156. Second metal layer or ETS 146 of symmetrical EPS 170 resides in a plane, which intersects component 156. Accordingly, only one conductive layer, conductive layer 120, is located above component 156, and only one conductive layer, conductive layer 166, is located below component 156 of symmetrical three layer EPS 170. Signal loop length is reduced compared to traditional three layer EPSs because only one conductive layer is located above and below component 156 in symmetrical EPS 170. Symmetrical EPS 170 is subject to reduced electrical noise as a result of the reduced signal loop length. Because ETS 146 resides in a plane located between a top surface of component 156 and a bottom surface of component 156, rather than below component 156, the total substrate thickness of symmetrical EPS 170 is reduced compared to a conventional three layer EPS. Symmetrical EPS 170 includes no additional material between insulating layer 124 and conductive layer 120. Conventional EPS's often have additional material, such as dry film, between the insulating and conductive layers, which can degrade reliability. The reliability of symmetrical EPS 170 is more stable than the reliability of conventional EPS's because symmetrical EPS 170 includes no additional material between insulating layer 124 and conductive layer 120.

Figure 4A:
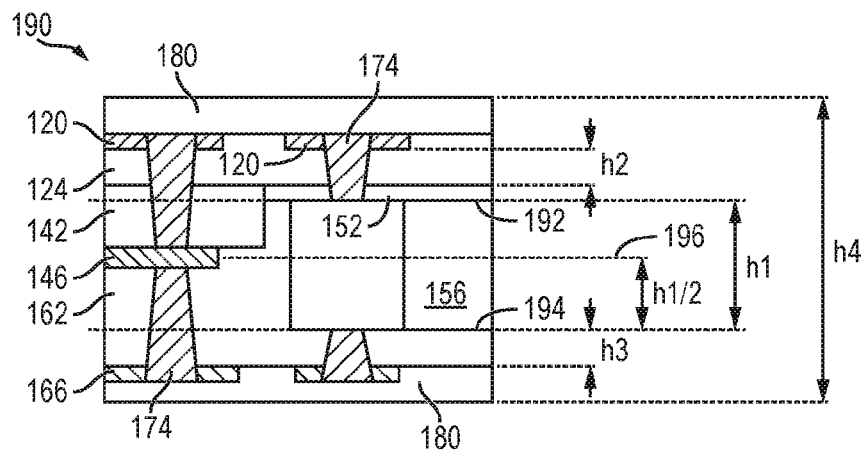
FIGS. 4a-4c illustrate other substrates with an embedded passive device and a symmetrical structure.
Figure 4B:
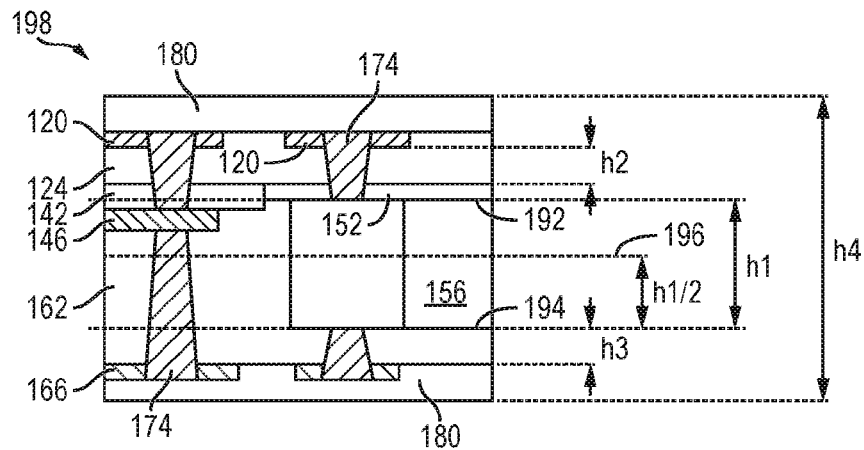
Figure 4C:
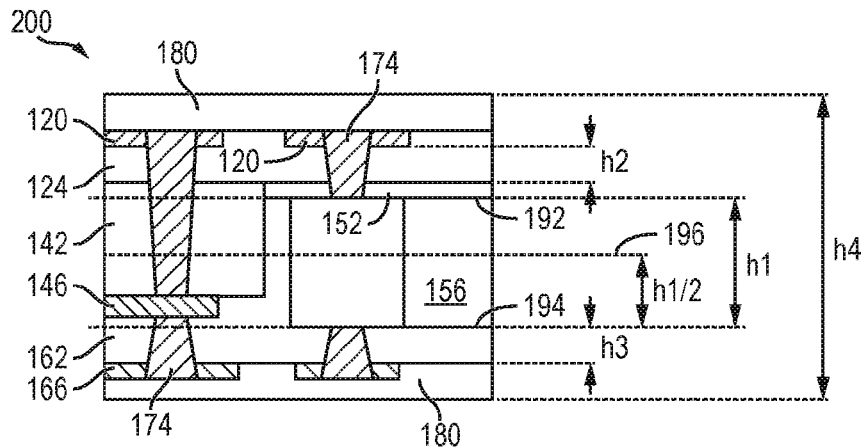

FIGS. 4a-4c show other symmetrical three layer embedded passive substrates, similar to symmetrical EPS 170 of FIG. 3o and made by the process described in FIGS. 3a-3o. FIG. 4a shows a portion of a cross-sectional view of symmetrical EPS 190, similar to symmetrical EPS 170 of FIG. 3o. Component 156 has a top surface 192 and a bottom surface 194, opposite the top surface. The height of component 156 is represented as h1. Reference plane 196, located at a midpoint of component 156, bisects component 156. The distance between bottom surface 194 and reference plane 196 is h1/2. The height or thickness of insulating layer 124 disposed between first metal layer or conductive layer 120 and adhesive layer 152 is represented as h2. The height or thickness of insulating layer 162 disposed between third metal layer or conductive layer 166 and bottom surface 194 of component 156 is represented as h3. Height h2 is approximately equal to height h3, meaning that height h2 has a value between 90% and 110% of the value of height h3 and therefore EPS 170 is a symmetrical substrate. In one embodiment, h2 equals h3. The total height or thickness of the substrate is represented as h4. Conductive layer 146 forms an ETS between insulating layers 142 and 162; ETS 146 resides in a plane located between top surface 192 of component 156 and bottom surface 194 of component 156. Second metal layer or ETS 146 of EPS 190 resides in a plane, which intersects component 156.

Warpage of symmetrical EPS 190 is reduced because the value of height h2 is between 90% and 110% of the value of height h3. ETS 146 resides in a plane located between top surface 192 of component 156 and bottom surface 194 of component 156. Accordingly, only one conductive layer, conductive layer 120, is located above component 156, and only one conductive layer, conductive layer 166, is located below component 156 of symmetrical three layer EPS 190. Signal loop length is reduced compared to traditional nonsymmetrical three layer EPSs because only one conductive layer is located above and below component 156 in symmetrical EPS 190. Symmetrical EPS 190 is subject to reduced electrical noise as a result of the reduced signal loop length. Because ETS 146 resides in a plane located between a top surface of component 156 and a bottom surface of component 156, rather than below component 156, total substrate thickness h4 of symmetrical EPS 190 is reduced compared to a conventional three layer EPS. The reliability of symmetrical EPS 190 is more stable than the reliability of conventional EPS's because symmetrical EPS 190 includes no additional material between insulating layer 124 and conductive layer 120.

FIG. 4a shows a portion of a cross-sectional view of symmetrical EPS 190. ETS 146 of symmetrical EPS 190 intersects reference plane 196, which bisects component

156. Reference plane 196, located at a height of h1/2, bisects component 156 and passes through ETS or conductive layer 146.

FIG. 4b shows a portion of a cross-sectional view of symmetrical EPS 198. ETS 146 of symmetrical EPS 198 resides in a plane located above reference plane 196, which bisects component 156. Reference plane 196, located at a height of h1/2, bisects component 156 and passes below ETS or conductive layer 146. ETS 146 of EPS 198 resides in a plane located below top surface 192 of component 156. ETS 146 of EPS 198 resides in a plane located below top surface 192 of component 156 and above reference plane 196, which bisects component 156.

FIG. 4c shows a portion of a cross-sectional view of symmetrical EPS 200. ETS 146 of symmetrical EPS 200 resides in a plane located below reference plane 196, which bisects component 156. Reference plane 196, located at a height of h1/2, bisects component 156 and passes above ETS or conductive layer 146. ETS 146 of EPS 200 resides in a plane located above bottom surface 194 of component 156. ETS 146 of EPS 198 resides in a plane located above bottom surface 194 of component 156 and below reference plane 196, which bisects component 156.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a first conductive layer;
   a first insulating layer formed over the first conductive layer;
   a second insulating layer formed over the first insulating layer including an opening formed through the second insulating layer;
   a second conductive layer formed over the second insulating layer;
   a semiconductor component disposed over the first insulating layer and in the opening of the second insulating layer with the second conductive layer within a height of the semiconductor component;
   a third insulating layer formed over the semiconductor component and extending into the opening of the second insulating layer, wherein a height of the first insulating layer under the semiconductor component is between 90% and 110% of a height of the third insulating layer over the semiconductor component;
   a third conductive layer formed over the third insulating layer;
   a first conductive via extending through the first insulating layer; and
   a second conductive via extending through the third insulating layer and aligned with the first conductive via.

2. The semiconductor device of claim 1, wherein the second conductive layer is in a plane that bisects the semiconductor component.

3. The semiconductor device of claim 1, wherein the semiconductor component includes a passive device.

4. The semiconductor device of claim 1, wherein the semiconductor component includes a capacitor.

5. The semiconductor device of claim 1, wherein the second insulating layer is formed directly on the first insulating layer.

6. The semiconductor device of claim 1, wherein the first conductive via physically contacts a first terminal of the semiconductor component and the second conductive via physically contacts the first terminal of the semiconductor component.

7. A semiconductor device, comprising:
   a first insulating layer;
   a first conductive layer formed over the first insulating layer;
   a semiconductor component disposed over the first insulating layer with the first conductive layer approximately centered between a top surface of the semiconductor component and a bottom surface of the semiconductor component, wherein the semiconductor component includes a terminal exposed at the top surface of the semiconductor component and the bottom surface of the semiconductor component;
   a second insulating layer formed over the semiconductor component;
   a first conductive via formed through the first insulating layer and physically contacting the terminal of the semiconductor component at the bottom surface of the semiconductor component; and
   a second conductive via formed through the second insulating layer and physically contacting the terminal of the semiconductor component at the top surface of the semiconductor component.

8. The semiconductor device of claim 7, further including a third insulating layer formed directly on the first insulating layer with the semiconductor component disposed in an opening of the third insulating layer.

9. The semiconductor device of claim 8, further including:
   a second conductive layer formed under the first insulating layer; and
   a third conductive layer formed over the second insulating layer.

10. The semiconductor device of claim 9, wherein the first conductive via extends through the second conductive layer and the second conductive via extends through the third conductive layer.

11. The semiconductor device of claim 7, wherein the semiconductor component includes a passive device.

12. The semiconductor device of claim 7, wherein the semiconductor component includes a capacitor.

13. The semiconductor device of claim 7, further including:
   a third conductive via formed through the first insulating layer to the first conductive layer; and
   a fourth conductive via formed through the second insulating layer to the first conductive layer.

14. A semiconductor device, comprising:
   a first conductive layer;
   a first insulating layer formed over the first conductive layer;
   a second insulating layer formed over the first insulating layer;
   a second conductive layer formed over the second insulating layer;
   a semiconductor component disposed in an opening of the second insulating layer;
   a third insulating layer formed over the second insulating layer and extending into the opening of the second insulating layer;
   a third conductive layer formed over the third insulating layer;
   a first conductive via extending through the first insulating layer; and a second conductive via extending through the third insulating layer and aligned with the first conductive via.

15. The semiconductor device of claim 14, wherein a height of the first insulating layer between the first conductive layer and semiconductor component is between 90% and 110% of a height of the third insulating layer between the semiconductor component and third conductive layer.

16. The semiconductor device of claim 14, wherein the second conductive layer lies in a plane that bisects the semiconductor component.

17. The semiconductor device of claim 14, wherein the semiconductor component includes a passive device.

18. The semiconductor device of claim 14, wherein the semiconductor component includes a capacitor.

19. The semiconductor device of claim 14, wherein the first conductive via is formed under a first terminal of the semiconductor component and the second conductive via is formed over the first terminal of the semiconductor component.

20. A semiconductor device, comprising:
a first insulating layer;
a first conductive layer formed over the first insulating layer;
a semiconductor component disposed over a surface of the first insulating layer, wherein the first conductive layer is approximately vertically centered between a top surface of the semiconductor component and a bottom surface of the semiconductor component;
a second insulating layer formed over the semiconductor component;
a first conductive via formed through the surface of the first insulating layer; and
a second conductive via formed through the second insulating layer and aligned with the first conductive via.

21. The semiconductor device of claim 20, wherein the semiconductor device includes a symmetrical structure.

22. The semiconductor device of claim 20, further including:
a second conductive layer formed under the first insulating layer; and
a third conductive layer formed over the second insulating layer.

23. The semiconductor device of claim 20, wherein the semiconductor component includes a passive device.

24. The semiconductor device of claim 20, wherein the first conductive via extends to the first conductive layer and the second conductive via extends to the first conductive layer.

25. The semiconductor device of claim 20, wherein the first conductive via is formed over a first terminal of the semiconductor component and the second conductive via is formed under the first terminal of the semiconductor component.

* * * * *